United States Patent [19]

Jayakar

[11] Patent Number: 4,994,405
[45] Date of Patent: Feb. 19, 1991

[54] AREA IMAGE SENSOR WITH TRANSPARENT ELECTRODES

[75] Inventor: Krishnakumar M. Jayakar, Rochester, N.Y.

[73] Assignee: Eastman Kodak Company, Rochester, N.Y.

[21] Appl. No.: 439,314

[22] Filed: Nov. 21, 1989

[51] Int. Cl.$^5$ .................. H01L 21/28; H01L 29/78
[52] U.S. Cl. .................................. 437/53; 357/24
[58] Field of Search ................. 437/53; 357/24 LR

[56] References Cited

U.S. PATENT DOCUMENTS 3,918,997  11/1975  Mohsen et al. ..................... 141/1.5

FOREIGN PATENT DOCUMENTS

| 253704 | 1/1988 | Fed. Rep. of Germany | 437/53 |
| 253705 | 1/1988 | Fed. Rep. of Germany | 437/53 |
| 3047872 | 10/1983 | Japan | 437/53 |
| 59-54146 | 3/1984 | Japan | 437/53 |
| 62-71273 | 4/1987 | Japan | 437/53 |

Primary Examiner—Olik Chaudhuri
Assistant Examiner—George R. Fourson
Attorney, Agent, or Firm—Raymond L. Owens

[57] ABSTRACT

A method of making a two phase image sensor having transparent electrodes self-aligned to the barrier implants.

1 Claim, 2 Drawing Sheets

AREA IMAGE SENSOR WITH TRANSPARENT ELECTRODES

FIELD OF THE INVENTION

This invention relates to a method for preparing two phase image sensor charge coupled devices.

BACKGROUND OF THE INVENTION

Charge coupled devices (hereinafter also referred to as CCD's) have found wide acceptance as shift registers for transporting charge in image sensors. A series of laterally spaced gate electrodes, adjacent but conductively separate from a semiconductor substrate, are relied upon to transfer the charge in discreet steps within the semiconductor substrate. Each charge transfer step is achieved by proper potential bias in gate electrodes, so that the charge is attracted from one storage region to a next adjacent charge storage region in the semiconductor substrate. Two phase devices are particularly advantageous since they require a minimum of real estate (chip surface area).

An early two phase CCD such as described in Kahng et al, U.S. Pat. No. 3,651,349, includes a semiconductor substrate of a first, N or P conductivity. An insulating layer is formed as a succession of alternating thinner portions and thicker portions overlying the semiconductor substrate, and a series of spaced apart conductive gate electrodes each overlying one thicker and one adjacent thinner portion of the insulating layer.

The art has progressed and shown a preference for two phase CCD's having a simpler insulative layer and gate electrode structure relying on zones of differential impurity doping concentrations in the semiconductor substrate for directionality bias of charge transfer.

Examples of two processes for making two phase CCD's are disclosed in commonly assigned U.S. Pat. Nos. 4,613,402 to Losee et al and 4,746,622 to Hawkins et al.

Heretofore, polysilicon has been the material of choice for gate electrodes. In frame transfer or full frame CCD image sensors, some of the light, more so of shorter wavelength (blue), is absorbed in the polysilicon electrodes and is thus "lost" or not counted as "signal." Transparent gate electrodes, such as indium tin oxide (ITO), tin oxide ($SnO_2$), or zinc oxide (ZnO), do not absorb as much light as polysilicon electrodes.

Two phase CCDs rely on having two sets of electrodes often formed by first depositing and patterning one set of polysilicon electrodes, then forming an insulating layer over this first set of electrodes and subsequently depositing and patterning a second set of polysilicon electrodes.

The insulating layer between and separating the two sets of electrodes is conveniently formed by converting the surface layer of the first set of electrodes to oxide when the electrodes are made of polysilicon. The prior art does not extend to the use of other materials for forming the first set of electrodes.

SUMMARY OF THE INVENTION

It is an object of this invention to:
(1) make "true" two-phase CCDs with self-aligned barrier implants; and
(2) use transparent conductor to make gate electrodes to reduce optical loss. The problems of electrically isolating two sets of overlapping electrodes is avoided by instead forming two sets of electrodes by patterning a single layer of deposited transparent conductor.

This invention achieves spaces between the two sets of electrodes that are smaller than the current state-of-the-art lithography permits.

The object is achieved in a method of making a two phase area image sensor having transparent electrodes comprising the steps of:

(a) sequentially forming on a substrate a gate oxide layer, a transparent conductor layer, a first polysilicon layer (poly-1), a nitride layer, a second oxide layer, and then forming a first mask on the second oxide layer;

(b) selectively etching the second oxide and nitride layers to form first windows and then depositing a second photoresist mask in these windows to provide a first openings and implanting dopant into the substrate through such first openings;

(c) removing the photoresist mask, selectively removing the second oxide layer leaving nitride strips, growing polyoxide on the exposed poly layer, and then removing the nitride strips;

(d) etching the poly-1 layer exposed after the nitride strips were removed to form second windows and providing third masks in such second windows leaving second openings and implanting dopant into the substrate through such second openings;

(e) removing the third masks and growing more oxide on the remaining second oxide layer and on the exposed poly-1 surfaces, depositing a layer of poly-2 and then a planarizing layer;

(f) etching back the planarizing layer to expose the poly-2 directly over the poly-1;

(g) selectively etching the exposed poly-2 to expose the polyoxide;

(h) selectively etching the polyoxide and the planarizing layer leaving poly-1 and poly-2 portions on the transparent conductor;

(i) etching the exposed transparent conductor between the poly-1 and poly-2 portions to make transparent electrodes; and (j) etching the poly-1 and poly-2 selectively to expose two sets of transparent electrodes.

In two-phase CCDs, directionality of charge transfer is achieved by creating a potential barrier and a potential well under each electrode. These barriers and wells are, in turn, created by implantation of suitable ions, e.g. boron or phosphorus, in part of the substrate under each electrode. It is essential that the method of fabrication be such as to obtain alignment between the edges of barriers and wells and the electrodes above them. Failure to do so will lead to incomplete charge transfer or low charge transfer efficiency.

The first part of this method, outlined in steps (a) through (d) above, achieves this critical edge alignment by using one mask, viz. the first mask, to define the edges of both the implants as well as the edges of two sets of electrodes.

Having done the edge aligned implants, the invention further makes two sets of electrodes from a single deposited layer of conductive material, such as ITO, $SnO_2$ or ZnO. Steps (e) through (h) above detail this process. For efficient operation of CCDs, it is important that gaps between neighboring electrodes be small so that the charge can transfer between the regions under the electrodes.

This method permits making narrow gaps while at the same time align the gaps with edges of dopant implants in the previous steps.

Further, creation of two sets of electrodes from a single layer obviates the need for an isolating insulator such as would be needed when overlapping electrodes are employed.

DESCRIPTION OF PREFERRED EMBODIMENT

The method of the present invention makes two phase CCD or comparable virtual phase CCD image sensors featuring accurate alignment of dopant implants and transparent gate electrodes. In addition, the invention is applicable to any device in which a barrier or well implant is desired below a transparent conductive electrode such that the implant and electrode are accurately edge-aligned such as a four phase CCD or CCD with lateral overflow drain. This is achieved by using a single primary mask and intermediate structures generated from it to set the edges of the dopant implants and the electrodes.

Figure 1A:
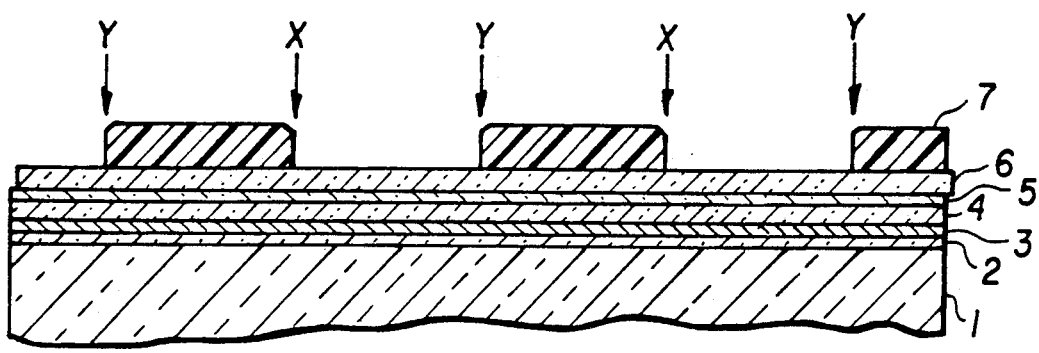
FIGS. 1a–i set forth various steps of a method in accordance with this invention.

Referring to FIG. 1a, a semiconductor substrate 1, such as p-type single crystal silicon wafer, having a buried n-type channel (not shown) has a grown layer of gate oxide 2. A transparent conductor layer 3, such as indium tin oxide (ITO), or tin oxide ($SnO_2$) or zinc oxide (ZnO), is then deposited. ITO is usually deposited by sputtering from an ITO target or by reactive sputtering from an indium-tin target. Other transparent conductors, such as $SnO_2$ or ZnO deposited by sputtering or chemical vapor deposition can be used. A layer 4 of silicon (poly-1), such as polysilicon or amorphous silicon, is then deposited followed by a layer of silicon nitride 5. These are deposited by conventional processes. A layer of oxide, 6, such as deposited silicon oxide or low temperature oxide (LTO) is then deposited. The thickness of this oxide layer 6 should be selected so as to provide sufficient boron ion stopping power, and this typically is about 5000 Å. The layers of LTO and nitride are then patterned by the use of first conventional photoresist mask 7, and conventional etch techniques to form LTO and nitride mask strips 8, and first window 9, through which underlying poly-1 is exposed. The edges of the first windows 9, are set by the edges, x and y of the first photoresist mask, 7.

Figure 1B:
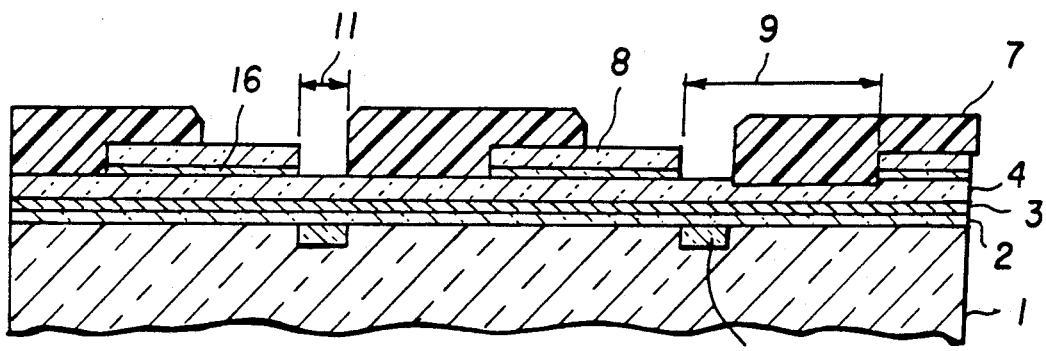

A second conventional photoresist mask 10, is then formed such that the LTO-nitride strips 8, and photoresist mask 10, define first openings 11 in the windows 9, as shown in FIG. 1b. Note that the first openings 11, are critically defined on one edge by strips 8, and in turn, by the edge of the first photoresist mask. The placement of second photoresist mask is not critical. This sets the stage for the first ion implantation of boron through first openings 11 to form potential barriers under first set of CCD gate electrodes. The implant energy is selected to insure that the boron is implanted below the interface between gate oxide 2, and substrate 1, and is shown as Bar 1. The combination of photoresist strips 10 and LTO-nitride strips 8 mask the boron implant and keep out the dopant everywhere else. The photoresist strips 10 and LTO portion of strips 8 are now removed by conventional means such as wet or dry stripping of photoresist and the use of buffered HF acid to remove LTO, leaving behind nitride strips 16.

Silicon oxide 12 is now grown on exposed portions of poly-1 in the windows 9. The nitride strips 16, prevent oxide growth elsewhere on poly-1. The nitride is subsequently removed by conventional etchants such as hot $H_3PO_4$ or by dry etch.

Figure 1C:
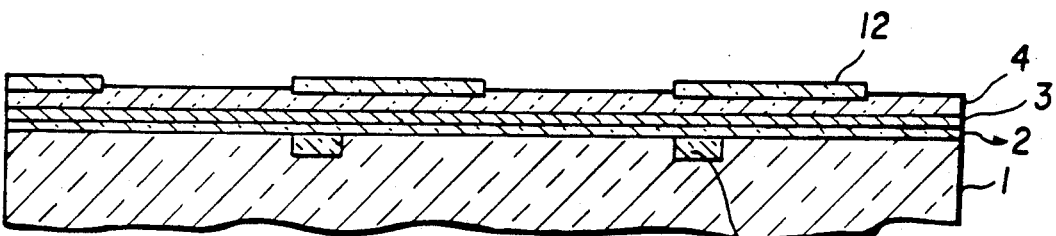

The image sensor device now appears as in FIG. 1c. The poly-1 previously covered by strips 8 is now exposed and selectively etched off by a suitable dry etching process. Oxide strips 12 serve as mask to prevent poly-1 strips 17 below them from etching. This produces a second set of windows 13, separated by poly-1 strips 17 and oxide strips 12.

Figure 1D:
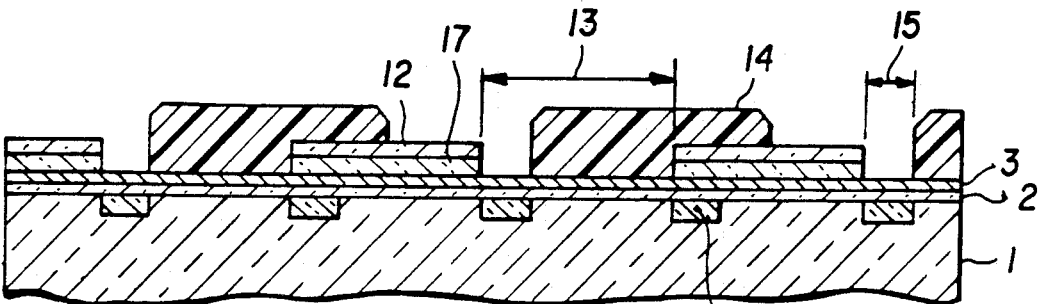

A third conventional photoresist mask 14 is then formed such that poly-1 strips 17 and oxide strips 12 and photoresist mask 14, define second openings 15, as shown in FIG. 1d. Note that the second openings 15, are critically defined on one edge by strips 12 and, in turn, by the edge y of the first photoresist mask. The placement of the third photoresist mask is not critical. A second ion implant of boron is then done through the second openings 15 to create regions of higher potential under the second set of CCD gate electrodes. The implant energy is selected to insure that boron is implanted below the interface between gate oxide 2 and substrate 1 and is shown as Bar 2. The combination of poly-1 strips 17 and oxide strips 12, and photoresist mask 14 prevent implant of boron everywhere else. The photoresist mask 14 is subsequently stripped off in a conventional manner.

At this point in the method additional steps can be conveniently introduced to make other necessary devices on the imaging chip such as implants for source and drain of the output transistors. Such steps can be done in conventional fashion.

Figure 1E:
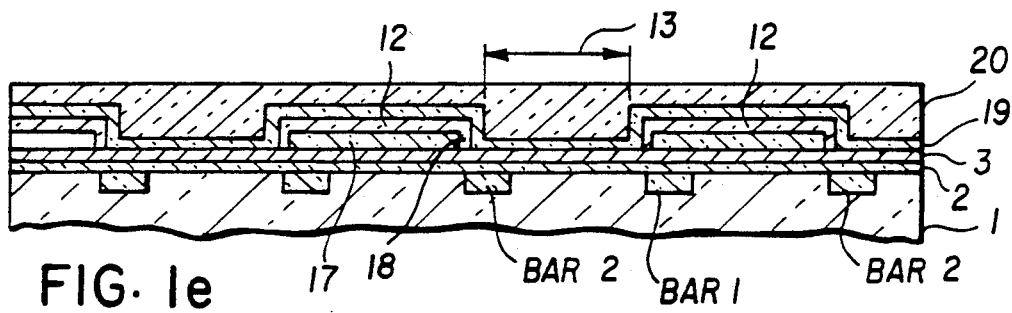

We have thus far created regions of higher potential Bar 1 and Bar 2 in the substrate with their critical edges defined by edges x and y of the first photoresist mask. Turning to FIG. 1e, more oxide is now grown on poly-1 strips 17 which already have oxide 12 on their upper surface. This causes the oxide 12 to grow thicker while at the same time oxide 18 grows on the lateral edges of poly-1 strips 17. The thickness of oxide 18 should be controlled as it will determine the thickness of space between the gate electrodes. An overall layer of silicon, poly-2 19, such as polysilicon or amorphous silicon, is then deposited to cover poly strips 17 and its oxide 12 and 18 as well as windows 13 conformally. A planarizing layer 20, such as photoresist or spin-on-glass is then coated on the entire surface. Conventional photoresist may be used for planarizing. Alternatively, spin-on-glass (SOG) may be used. SOG is a siloxane in an organic base and can be applied by spin coating. A soft bake after coating at 150°–350° C. removes the solvent base. The resulting layer 20 is then cured at about 425° C. for about one hour. The resulting layer is nearly 100% silicon dioxide. The planarizing layer 20, is then etched back by conventional dry etching method so as to expose poly-2 films 19 that lies over the strips of poly-1, 17, as shown in FIG. 1f.

Figure 1F:
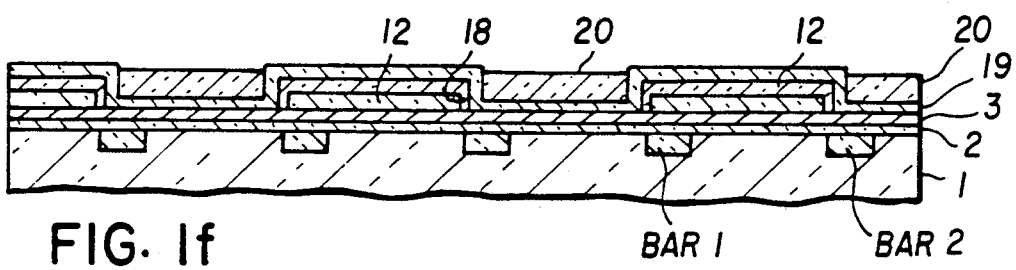
Figure 1G:
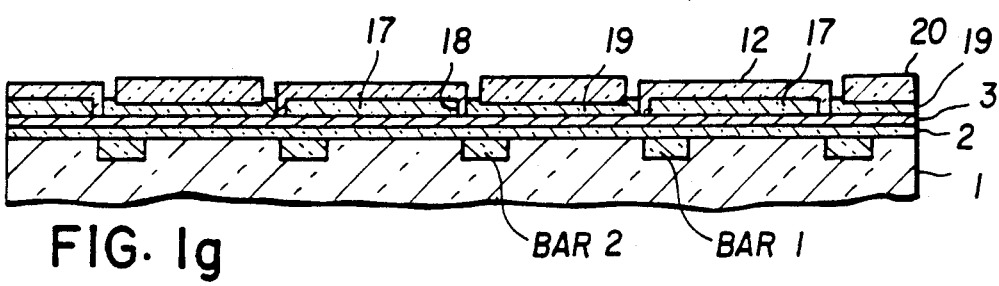
Figure 1H:
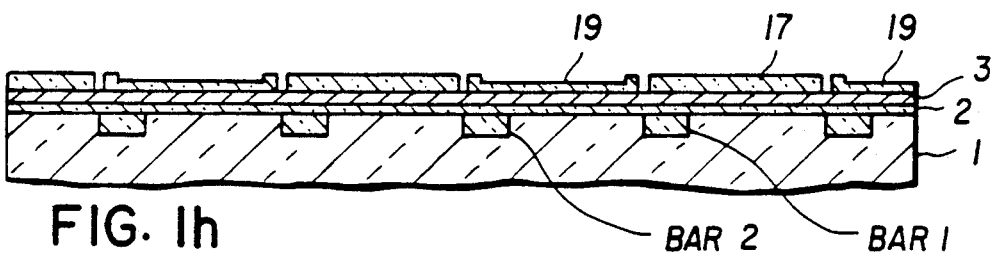
Figure 1I:
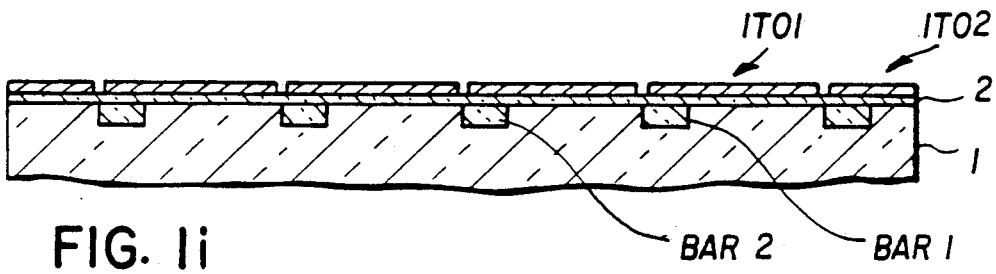

The poly-2 layer covering the windows 13 is still covered with planarizing film 20 as shown in FIG. 1f. The poly-2 film exposed as above is then selectively etched away, preferably by a conventional dry etching method producing the structure shown in FIG. 1g. The planarizing photoresist or SOG, as well as all the poly oxide 12 and 18, are etched away selectively with respect to poly-1 and poly-2. Conventional wet or dry etching can accomplish this. This method produces the structure shown in FIG. 1h which has strips of poly-1 and poly-2 lying over ITO 3. Note that poly-1 and poly-2 strips are aligned at their edges with Bar 1 and Bar 2 implants. These strips are now used as a mask to etch "spaces" in underlying ITO layer 3. ITO can be etched selectively with respect to poly with suitable wet etchants such as hot HI acid. These spaces effectively segment ITO layer into two electrodes ITO-1 and ITO-2 under poly-1 and poly-2 strips, respectively. Now the poly-1 17 and poly-2 19 mask are etched away selectively to expose ITO-1 and ITO-2 electrodes as shown in FIG. 1i.

CCD image sensor devices can be completed following well known conventional fabrication practices.

The invention has been described in detail with particular reference to a certain preferred embodiment thereof, but it will be understood that variations and modifications can be effected within the spirit and scope of the invention.

I claim:

1. A method of making a two phase image sensor having transparent electrodes comprising the steps of:
   (a) sequentially forming on a substrate a gate oxide layer, a transparent conductor layer, a first polysilicon layer, a nitride layer, a second oxide layer, and then forming a first mask on the second oxide layer;
   (b) selectively etching the first oxide and nitride layers to form first windows and then depositing a second photoresist mask in these windows to provide first openings and implanting dopant into the substrate through said first openings;
   (c) removing the photoresist mask, selectively removing the second oxide layer leaving nitride layer strips, growing a third oxide layer on the exposed poly layer, and then removing the nitride strips;
   (d) etching the portion of the first polysilicon layer exposed after the nitride strips were removed to form second windows and providing a third maks in said second windows leaving second openings and implanting dopant into the substrate through said second openings;
   (e) removing the third mask and growing more oxide on the remaining second oxide layer and on the exposed first polysilicon layer surfaces, depositing a second polysilicon layer and then a planarizing layer;
   (f) etching back the planarizing layer to expose the second polysilicon layer directly over the first polysilicon layer;
   (g) selectively etching the exposed second polysilicon layer to expose the third oxide layer;
   (h) selectively etching the third oxide layer and the planarizing layer leaving first polysilicon layer and second polysilicon layer portions on the transparent conductor;
   (i) etching the exposed transparent conductor between the first polysilicon layer and second polysilicon layer portions to make transparent electrodes; and
   (j) etching the first polysilicon layer and second polysilicon layer selectively to expose two sets of transparent electrodes.

* * * * *